United States Patent
Bradley et al.

(10) Patent No.: US 6,877,194 B2
(45) Date of Patent: Apr. 12, 2005

(54) OPEN FRAME TRAY CLIP (75) Inventors: Scott C. Bradley, Carlsbad, CA (US); James D. Pylant, Temecula, CA (US)

(73) Assignee: Peak Plastic & Metal Products (International) Ltd., Hong Kong (HK)

( * ) Notice: Subject to any disclaimer, the term of this patent is extended or adjusted under 35 U.S.C. 154(b) by 0 days.

(21) Appl. No.: 10/619,750

(22) Filed: Jul. 14, 2003

(65) Prior Publication Data

US 2005/0011055 A1 Jan. 20, 2005

(51) Int. Cl.⁷ .......... A44B 21/00; B65D 67/02; B65D 85/86
(52) U.S. Cl. .......... 24/570; 206/307.1; 206/710; 206/449; 206/451; 211/126.1
(58) Field of Search .......... 24/570; 206/8, 206/815, 832, 833, 387.1, 387.14, 307.1, 308.3, 710, 711, 712, 449, 451, 555, 454; 379/455; 211/40, 49.1, 50, 133.6, 121.1, 126.16; 455/575.1, 575.4, 575.8; 312/185, 170, 183

(56) References Cited

U.S. PATENT DOCUMENTS 2,211,879 A * 8/1940 Cave .......... 224/570
4,326,653 A * 4/1982 Stone .......... 206/387.14
5,659,612 A * 8/1997 Wang .......... 379/455
5,983,468 A * 11/1999 Evans et al. .......... 24/570

FOREIGN PATENT DOCUMENTS

JP    2000025831    1/2000

* cited by examiner

Primary Examiner—Robert J. Sandy
(74) Attorney, Agent, or Firm—Isabelle R. McAndrews (57) ABSTRACT A clip is provided for holding a stack of trays and a tray cover. The clip has a base having a width providing clearance for a width of a tray and a cut-away relief area for finger access. First and second opposing resilient side walls and a resilient back wall extend upward from the base, forming a structure with an open front and top. First and second resilient, elongated and downwardly curved members are included, each having a proximal end attached to an upper front of a corresponding side wall, and a distal end attached to the back wall. The resilient members are positioned so as to apply pressure to first and second opposing perimeter portions of a tray placed in the clip.

36 Claims, 7 Drawing Sheets

PRIOR ART

SECTION A-A

OPEN FRAME TRAY CLIP

BACKGROUND OF THE INVENTION

1. Field of the Invention

This application is related to U.S. patent application Ser. No. 10/620,282 entitled "Bare Die fray Clip" filed the same day as this application, and which is expressly 2incorporated by reference herein.

This invention relates generally to apparatus for securing trays that are used in storing or transporting components such as semiconductors, and more particularly to an open frame clip for securing a stack of trays and a cover that places stack compression forces on tray perimeters for accommodating large tolerances in stack heights, and provides a clear view of a tray label and improved clearance for operator access to insert and remove a stack.

2. Description of the Prior Art

Figure 1:
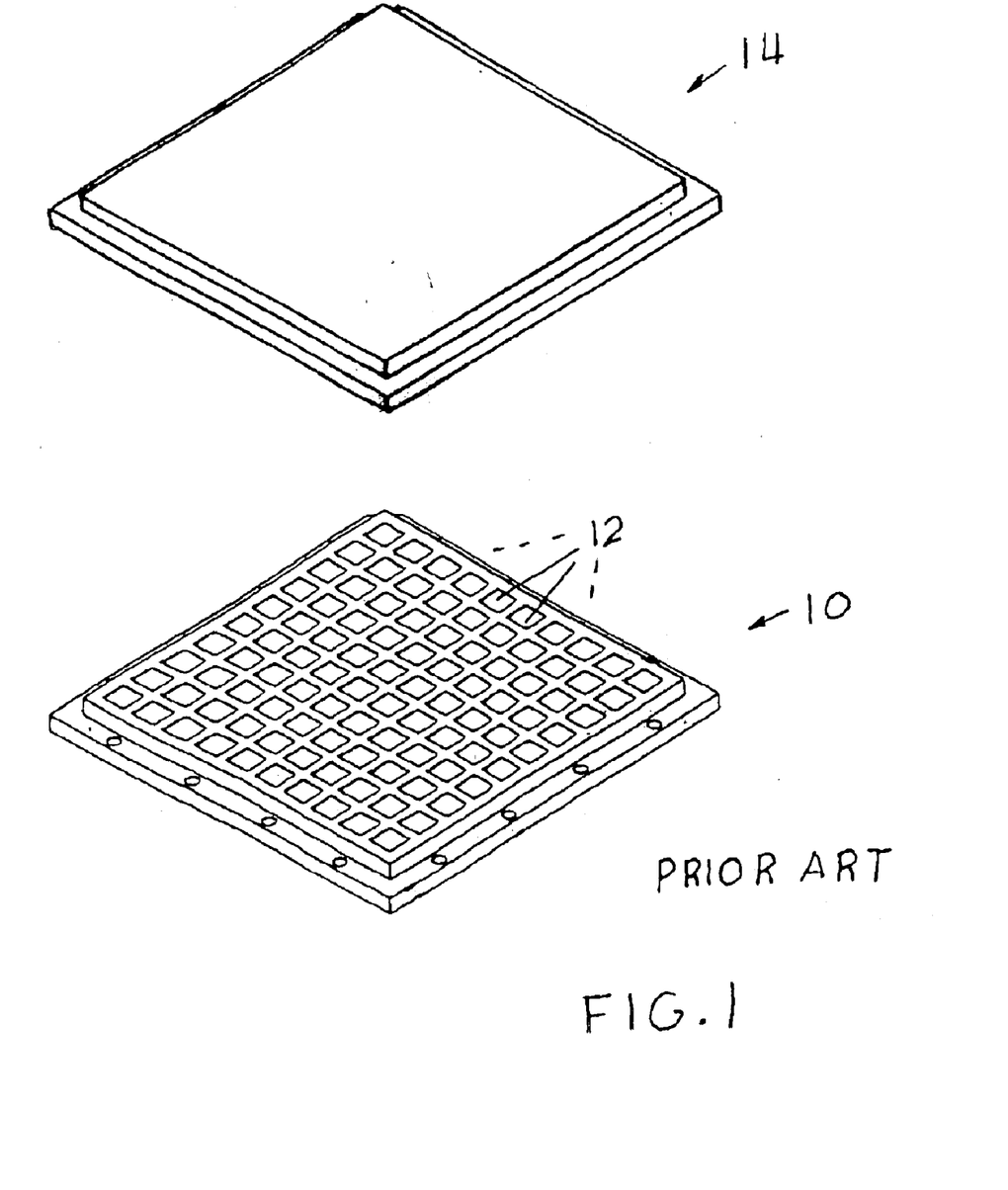
FIG. 1 shows a prior art tray and cover.
Figure 2:
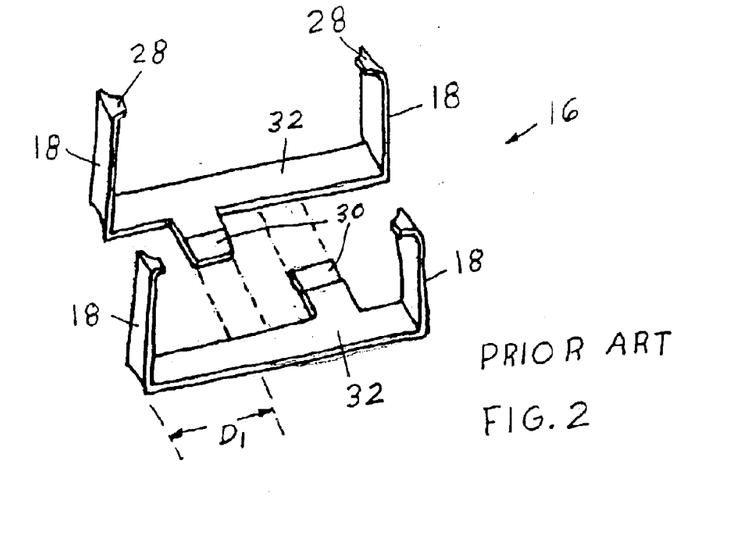
FIG. 2 illustrates a prior art two piece clip.
Figure 3:
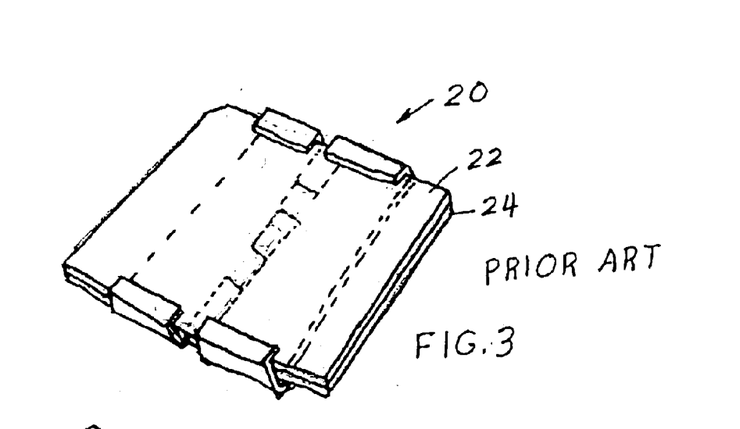
FIG. 3 illustrates a clip of the type shown in FIG. 2 holding a stack.
Figure 4:
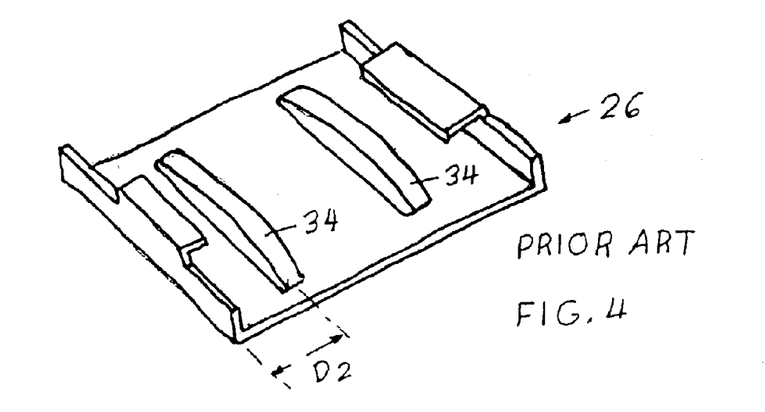
FIG. 4 shows a prior art clip having two centrally located springs for applying stack pressure.

Small components such as semiconductors are often stored or shipped in molded plastic trays such as tray 10 shown in FIG. 1. With the components (not shown) in pockets 12, a cover such as cover 14 is placed over the tray 10 for captivating the components in the pockets 12. It is then often necessary to apply a device to secure the top 14 to the tray 10. For example, FIG. 2 illustrates a two part clip apparatus 16 used to clamp a tray and cover together, or a stack of trays and a cover together. The height of leg 18 is designed to accommodate the height of the stack. FIG. 3 illustrates the use of a two part clip apparatus 20 for securing a cover 22 to a tray 24. FIG. 4 illustrates another type of tray clip 26.

In order for the stack of trays to be secure, the clip provides a compressive force to the stack. Prior art designs apply force to a central area of the bottom of the stack, which eventually causes permanent warp/distortion of the trays. Prongs such as 28 (FIG. 2) are used at the stack top, with the opposing force in the central area of the bottom of the stack. In FIG. 2, each of the extensions 30 slide under the corresponding mating part and provide an interference, causing the base 32 to bend in a manner that results in the clip applying a spring force when the clips are installed on a stack.

FIG. 4 shows another clip apparatus 26 with two leaf springs 34 for application of force to a stack inserted in the clip 26. The designs of FIGS. 2–4 apply a leverage to the tray, operating between each of the top prong contact points and the corresponding area of contact on the central area of the bottom of the stack. The leverage applied to the tray by the spring force is proportional to the distances roughly indicated for example by dimensions $D_1$ and $D_2$ resulting in application of a bending force to the trays. This force causes damage due to the application of the force in the thin and weak central area. As the trays warp over time, gaps are produced between trays in a stack. In some cases, the components stored in a tray can-fall through the gaps, or be pinched ir) a gap, causing damage to the component. In addition, when a stack of trays is removed from a clip, and a tray is presented to an automated pick and place machine, the warped, distorted tray can cause pick-up errors.

Figure 5:
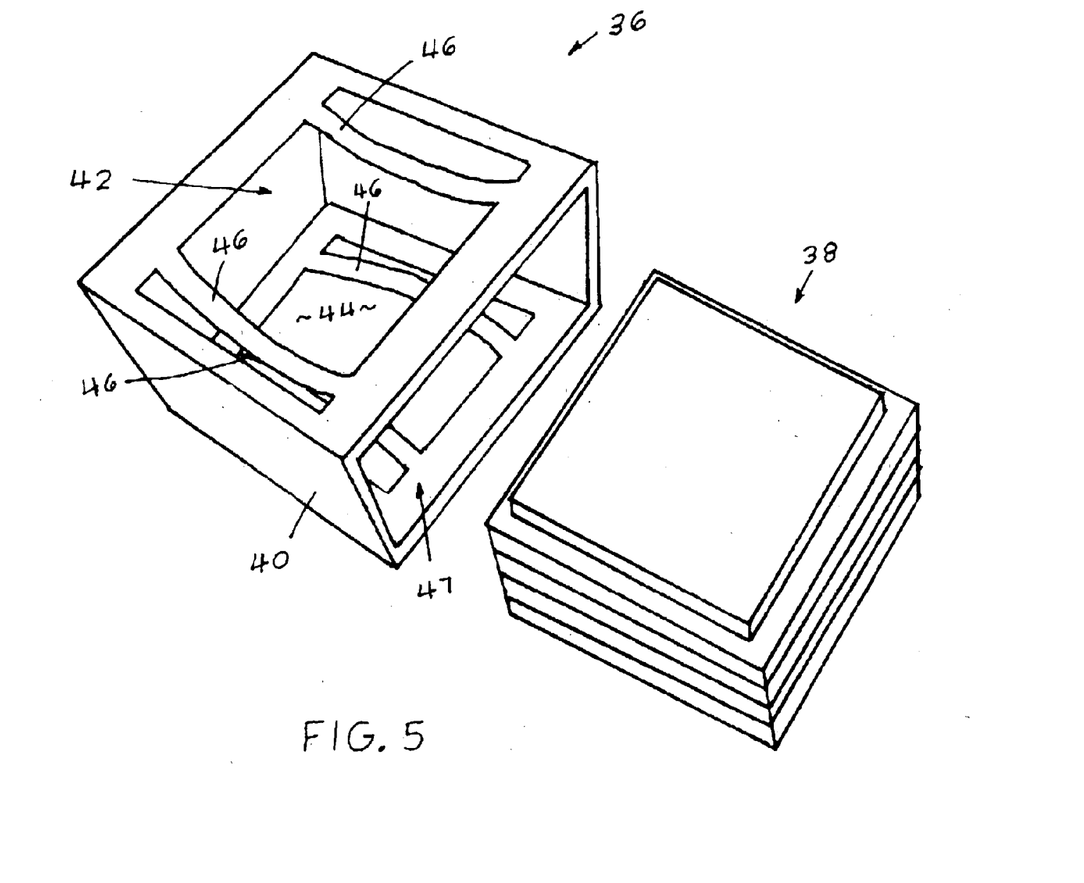
FIG. 5 shows another prior art clip in the form of a box frame.

FIG. 5 shows another prior art clip 36 for holding a stack of trays 38. The structure is a rigid box frame 40 with openings 42 and 44 on the top and bottom for finger access to slide the stack out an opening 47 of the clip 36. Four leaf springs 46, including two on the top and two on the bottom, apply pressure to the top and bottom of the stack 38 to hold it in place. A disadvantage of this design includes the pressure of the springs 46 located within the more fragile central area of the trays, and the limited openings 42 and 44 which obscure the view of the tray labels. Also, the springs 46 do not allow enough motion to properly accommodate stacks of trays with minimum or maximum tolerances.

SUMMARY

It is an advantage of this invention in that it provides an improved clip for securing a stack of trays that minimizes warp due to tray clip forces.

It is a further advantage of this invention in that it provides a clip for securing a stack of trays that confines the retaining forces to the tray edges and therefore minimizes leverage to the stack and reduces tray warpage.

In one embodiment of the present invention, a clip is provided for holding a stack of trays and a tray cover. The clip has a base having a width providing clearance for a width of a tray and a cut-away relief area for finger access. First and second opposing resilient side walls and a back wall that is also preferably resilient extend upward from the base, forming a structure with an open front and top. First and second resilient, elongated and downwardly curved members are included, each having a proximal end attached to an upper front of a corresponding side wall, and a distal end attached to the back wall. The resilient members are positioned so as to apply pressure to first and second opposing perimeter portions of a tray placed in the clip.

DESCRIPTION OF THE PREFERRED EMBODIMENTS

Figure 6:
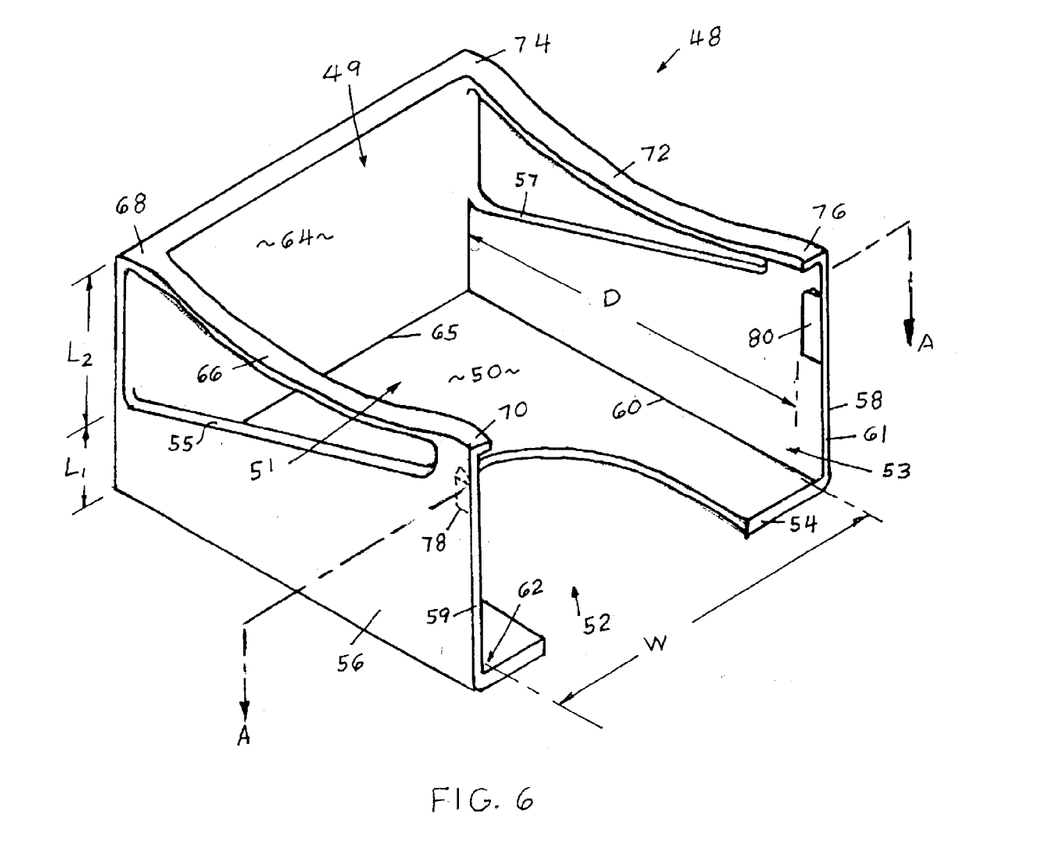
FIG. 6 illustrates an embodiment of the present invention as an open frame clip for storing a stack of trays.

Referring now to FIG. 6 of the drawing, an open frame clip 48 according to the present invention is shown in a perspective view. The clip 48 is configured for storing a stack of trays, or trays and a tray cover in a chamber-49. The clip 48 housing has a base 50 with a tray storing area of width "W" and depth "D". The base 50 has a cut-out 52 extending inward from a front edge 54 of the base 50 allowing access for an operator's finger for gripping the bottom of a stack of trays. First and second sidewalls 56 and 58, constructed of resilient material extend at substantially right angles to the base 50 from opposing first and second base edges 60 and 62. The top 51 and front tray entry 53 are notably open, facilitating operator installation and removal of a tray stack, and allowing a clear view Of stack labeling. The side walls 56 and 58 are unsupported on at least two edges having no connection between them on the upper edges 55 and 57 and front edges 59 and 61. A back wall 64, also constructed of resilient material, allows for movement as described further herein, is attached to a rear edge 65 and extends orthogonally from the base 50. The clip can be constructed from any of various materials that will be apparent to those skilled in the art. For example, polycarbonate or polypropylene, or either of these with a carbon filling which adds an antistatic property. Methods of construction of the clip will also be apparent to those skilled in the art, such as molding. These construction materials and methods and others that will be apparent to those skilled in the art are included in the spirit of the present invention. A portion $L_1$ at the back wall 64 joins at right angles to rear edges of the first and second side walls 56 and 58, leaving an unsupported back wall portion $L_2$, which portion is preferably resilient. The length $L_2$ of the back wall is preferably also resilient to add flexible motion in cooperation with elongated first and second resilient members 66 and 72 for accommodating large tolerances in a height of a stack to be stored in the chamber 49.

The first resilient, elongated and curved spring member 66 has a distal end 68 connected substantially adjacent a first upper corner portion of the resilient back wall 64, and is connected at a proximal end 70 to an upper front end of the first side wall 56. The member 66 extends over an area adjacent to the first side wall 56 and interior to the chamber 49 between the first and second side walls for applying pressure on a first side of a top perimeter area of a stack of trays. Similarly, the second resilient, elongated and curved member 72 is connected at a distal end 74 substantially adjacent a second upper corner part of the back wall 64, and is connected at a proximal end 76 to an upper front end of the second side wall 58. The member 72 extends over an area adjacent the second wall 58 and interior to the chamber 49 between the first and second side wails so as to apply pressure on a second side of a top perimeter area of a stack of trays.

First and second tabs 78 and 80 extend inwardly toward chamber 49 from a front portion of the side walls 56 and 72 respectively for captivating a stack of trays placed in the clip 48. The operation of the tabs will be explained in reference to the following figures of the drawing.

Figure 7:
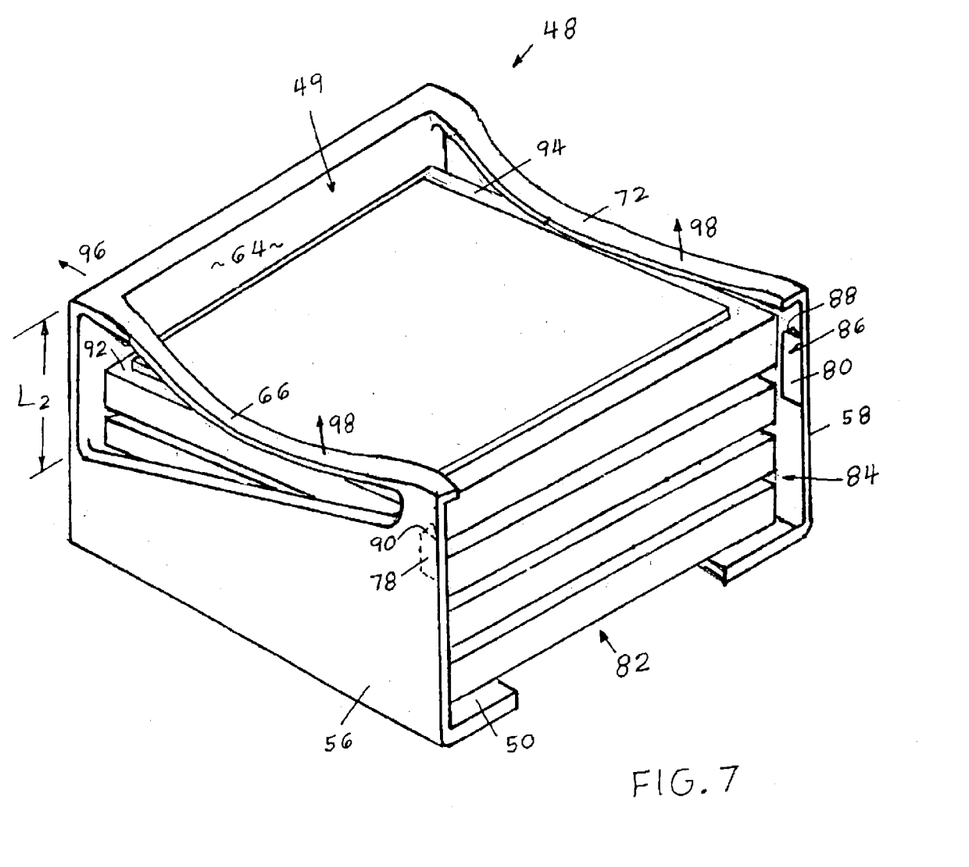
FIG. 7 shows a stack installed in the clip of FIG. 6.

FIG. 7 shows a stack of trays enclosed in the chamber 49 of the clip 48. The stack 82 has been inserted through the front opening 84 of the clip. In order to insert the stack, the tabs 78 and 80 in one embodiment are configured with a tapered input plane such as plane 86 of tab 80. As the stack is pushed into the opening 84, the stack pushes against the surfaces 86, causing the walls 56 and 58 to bend outward. With the stack 82 inserted past the tabs 78 and 80, the resilient walls 56 and 58 collapse back to their rest state, which places abrupt edges 88 and 90 in the path of the tray stack 82, which keeps the stack from exiting out the opening 84. In order to remove the stack, an operator forces the walls 56 and 58 outward so as to move the tabs out of the path of exit of the stack, and gripping the stack through the access 52 (FIG. 6) and the open top 51, pulls the stack out the opening 84. The height of a stack in the clip 48 is securely held by the springs 66 and 72 pressing on the perimeter areas 92 and 94 of the stack, forcing the stack against the base 50. The movement of the springs 66 and 72 is facilitated in part by corresponding outward movement of the resilient upper portion $L_2$ of the back wall 64. The thickness of the wall 64 and the length $L_2$, and the degree of curvature of the elongated members 66 and 72 can be designed to allow the required flexible, resilient movement to accommodate stack tolerances. Arrow 96 indicates the direction of movement of the wall 64 as the springs 66 and 72 move in the direction indicated by arrows 98.

Figure 8:
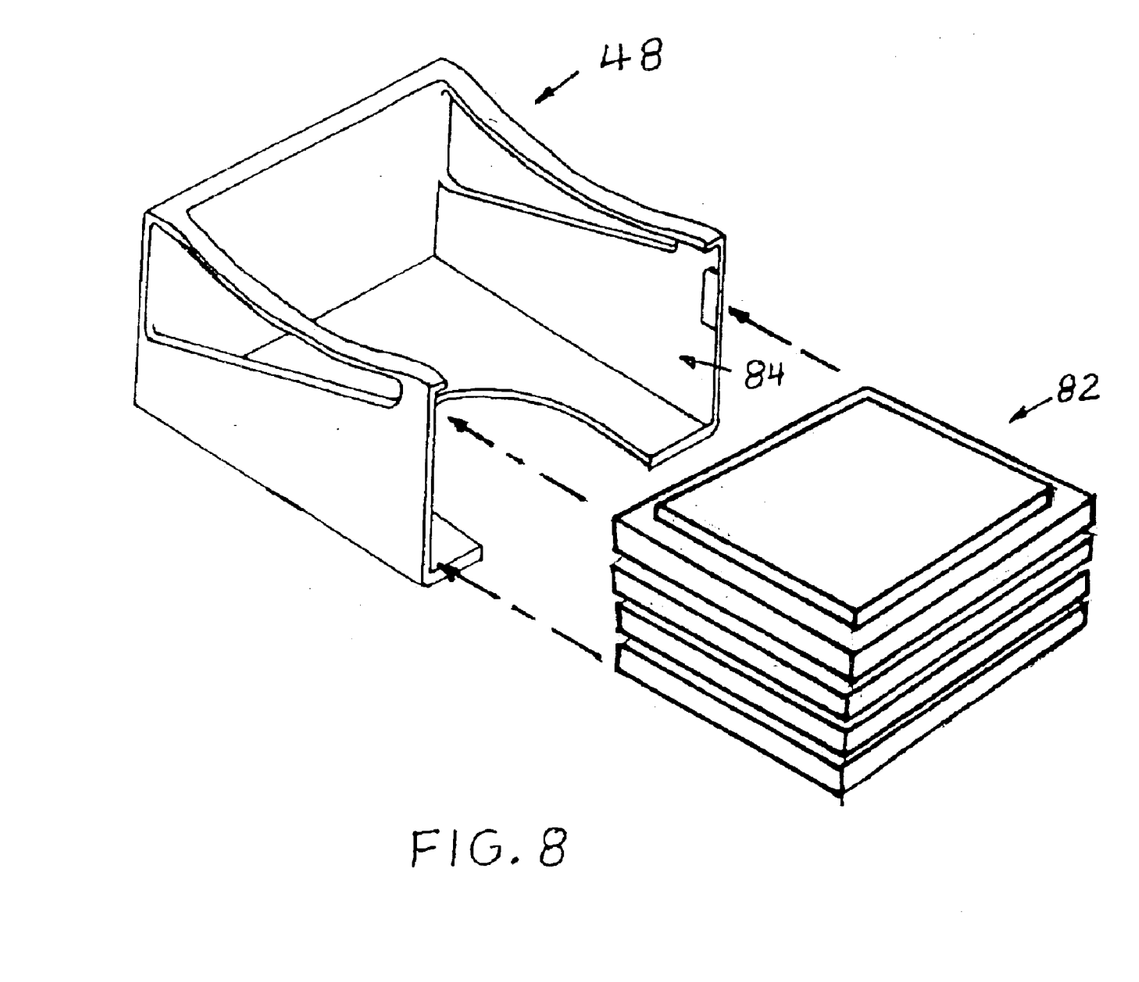
FIG. 8 illustrates a method of inserting a stack in the clip of FIG. 6.

FIG. 8 illustrates a stack 82 in position for sliding into the front opening 84 of the clip 48.

Figure 9:
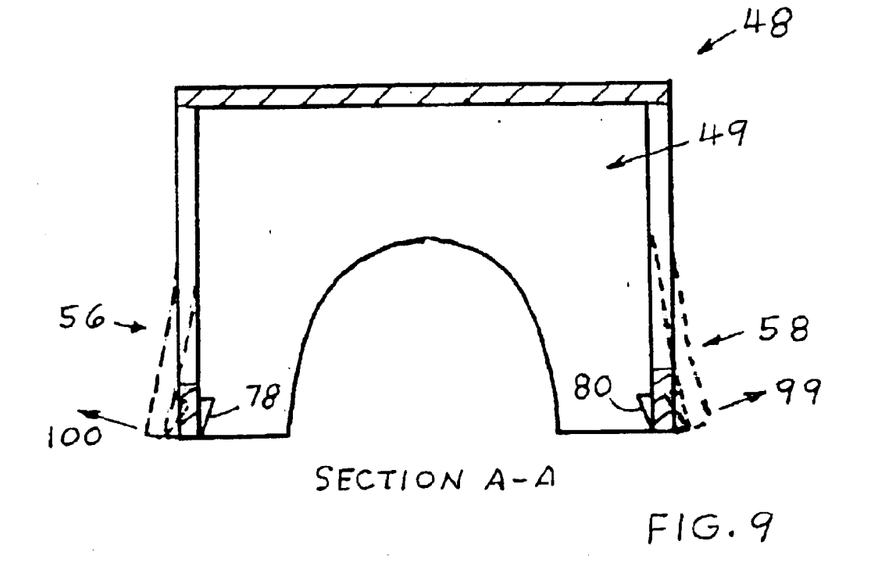
FIG. 9 is a planar, cross sectional view illustrating the flexible side walls for displacing stack retainer tabs, for allowing entry and exit of a stack.

FIG. 9 is a cross sectional view A—A from FIG. 6 for illustrating the outward movement of the walls 56 and 58, indicated by the dashed lines. In order for a stack to be inserted and removed from the chamber 49, the tabs 78 and 80 are moved outward as indicated by arrows 99 and 100 by bending the resilient walls 56 and 58.

Figure 10:
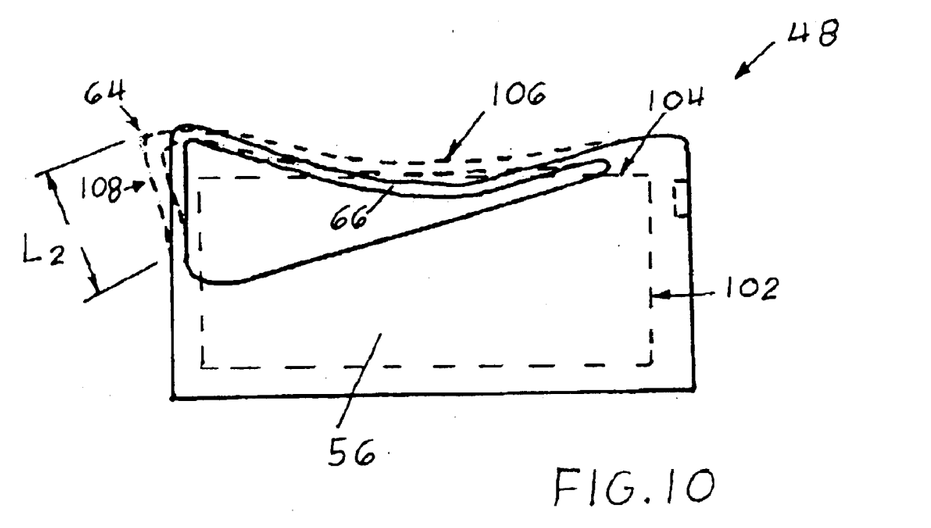
FIG. 10 is a side planar view of the clip for illustrating the flexible spring action of the combination resilient back wall and elongated resilient member, for accommodating large tolerances in stack height.

FIG. 10 is a planar view of side 56 of the clip 48 for describing more clearly the operation of the flexible, resilient back wall 64 in cooperation with the elongated members 66 and 72. The dashed line 102 represents the outline of a stack placed in the clip 48. The upper perimeter area is represented by portion 104 of the dashed outline 102. FIG. 10 shows member 66 and back wall 64 in a relaxed state prior to inserting the stack by the solid lines. The dashed lines 106 represent the member 66 and back wall 64 position upon insertion of the stack, which forces the spring 66 upward, which causes outward movement of back wall 64.

The preferred embodiment as described above, and variations that will be apparent to those skilled in the art, limit the application of pressure to the perimeter areas of a tray. As a further alternate embodiment, pressure can additionally be applied to non-perimeter areas and these additions that will be apparent to those skilled in the art are included in the present invention.

While the present invention has been described herein with reference to particular embodiments thereof, a latitude of modifications, various changes and substitutions are intended in the foregoing disclosure, and it will be appreciated that in some instances some features of the invention will be employed without a corresponding use of other features without departing from the spirit and scope of the invention as set forth in the appended claims.

What is claimed is:

1. A clip containing a stack of trays, the stack having first and second opposing perimeter areas associated therewith, comprising:
  a housing that defines a chamber containing said stack therein, the chamber being accessible from an open front area and an open top area, without any support structure connecting between the open top area and open front area, said housing including:
  a base adapted to support a bottom of the stack, said base having a front edge, first and second opposing edges, and a back edge;
  a back wall that restrains the stack within said chamber; and
  first and second side walls attached to said first and second opposing edges respectively adapted to restrain the stack laterally in said chamber; and
  first and second resilient members attached at proximal ends to the respective first and second side wall and at distal ends to the back wall, wherein said first and second resilient members are adapted to resiliently move when the stack of trays is being inserted into said chamber in order to clamp the stack in the chamber once the stack is inserted into the chamber.

2. The clip of claim 1 wherein the back wall has a lower back surface and an upper back surface;

each of said first and second side walls have a front edge that defines a front height of the open front area, and a back edge of height less than said front height attached to a lower back surface of the back wall, and wherein said back wall has an upper back surface extending above said lower back surface; and the first and second resilient members have the proximal ends connected to a top portion of said first and second side walls, respectively, and the distal ends connected to an upper portion of said upper back surface of the back wall, wherein said members are adapted to resiliently move into a portion of an open sidewall area when clamping the stack in the chamber, and wherein said first and second resilient members extend inward into said chamber from said first and second side walls respectively.

3. The clip of claim 2, wherein the upper back surface of the back wall is resilient and is adapted to resiliently move in coordination with the first and second resilient members when the stack is being inserted into or removed from said chamber.

4. The clip of claim 3, wherein the top front edge of the first and second side walls are each resilient and adapted to move outwards to temporarily enlarge a width of the chamber when the stack is being inserted into or removed from said chamber.

5. The clip of claim 4, further comprising first and second tabs attached to a front portion of the first and second sidewalls, respectively, that each tab project into the chamber a predetermined distance and hold the stack in the chamber after the stack has been inserted into the chamber; and wherein the top front edge of the first and second sidewalls are resilient so as to be movable outwards to temporarily enlarge the width of the chamber at a location of the first and second tabs in an amount that corresponds to the predetermined distance until the stack has been inserted into or removed from the chamber.

6. The clip of claim 2, wherein the top front edge of the first and second side walls are each resilient and adapted to move outwards to temporarily enlarge a width of the chamber when the stack is being inserted into or removed from said chamber.

7. The clip of claim 6, further comprising first and second tabs attached to a front portion of the first and second sidewalls, respectively, that each tab project into the chamber a predetermined distance and hold the stack in the chamber after the stack has been inserted into the chamber; and wherein the top front edge of the first and second sidewalls resilient so as to be movable outwards to temporarily enlarge the width of the chamber at a location of the first and second tabs in an amount that corresponds to the predetermined distance until the stack has been inserted into or removed from the chamber.

8. The clip of claim 1 wherein the back wall has a lower back surface and an upper back surface, and the upper back surface of the back wall is resilient and is adapted to resiliently move in coordination with the first and second resilient members when the stack is being inserted into said chamber.

9. The clip of claim 8 made by injection molding.

10. The clip of claim 8, wherein the top front edge of the first and second side walls are each resilient and adapted to move outwards to temporarily enlarge a width of the chamber when the stack is being inserted into or removed from said chamber.

11. A clip of claim 10 made by injection molding.

12. The clip of in claim 10, further comprising first and second tabs attached to a front portion of the first and second sidewalls, respectively, that each tab project into the chamber a predetermined distance and hold the stack in the chamber after the stack has been inserted into the chamber; and wherein the top front edge of the first and second sidewalls are resilient so as to be movable outwards to temporarily enlarge the width of the chamber at a location of the first and second tabs in an amount that corresponds to the predetermined distance until the stack has been inserted into or removed from the chamber.

13. The clip of claim 12 made by injection molding.

14. The clip of claim 1, wherein a top front portion of the first and second side walls are each resilient and adapted to move outwards to temporarily enlarge a width of the chamber when the stack is being inserted into or removed from said chamber.

15. The clip of claim 14 made by injection molding.

16. The clip of claim 14, further comprising first and second tabs attached to a front portion of the first and second sidewalls, respectively, that each tab project into the chamber a predetermined distance and hold the stack in the chamber after the stack has been inserted into the chamber; and wherein the top front edge of the first and second sidewalls are resilient so as to be movable outwards to temporarily enlarge the width of the chamber at a location of the first and second tabs in an amount that corresponds to the predetermined distance until the stack has been inserted into or removed from the chamber.

17. The clip of claim 16 made by injection molding.

18. The clip of claim 1 wherein said first and second resilient members are configured to limit application of pressure to a perimeter area of said stack.

19. The clip of claim 1 wherein said first and second resilient members are configured to apply pressure to both perimeter and non-perimeter areas of said stack.

20. A clip containing a stack of trays for semiconductor components comprising:

a housing that defines a chamber containing the stack of semiconductor trays therein, the chamber being accessible from an open front area and an open top area;

a base adapted to support a bottom of the stack, said base having a front edge, and first and second opposing edges, wherein said base has a cut-out extending inwardly from the front edge;

a back wall that restrains the stack within said chamber; and first and second side walls attached to said first and second opposing edges respectively adapted to restrain the stack laterally in said chamber.

21. The clip of claim 20, wherein the cut out is located approximately in the center of the base.

22. The clip of claim 20, wherein the first and second resilient members are attached at proximal ends to the respective first and second side wall and at distal ends to the back wall.

23. The clip of claim 20, wherein a top front portion of the first and second side walls are each resilient and adapted to move outwards to temporarily enlarge a width of the chamber when the stack is being inserted into or removed from said chamber.

24. The clip of claim 20, wherein said back wall extends orthogonally from the base and is substantially planar.

25. The clip of claim 20, further comprising first and second tabs attached to a front portion of the first and second sidewalls, respectively, wherein each tab projects into the chamber a predetermined distance and secures the semiconductor stack in the chamber after the semiconductor stack has been inserted into the chamber.

26. A clip containing a stack of trays for semiconductor components comprising:
   a housing that defines a chamber containing the stack of semiconductor trays therein, the chamber being accessible from an open front area and an open top area;
   a base adapted to support a bottom of the stack, said base having a front edge, and first and second opposing edges;
   a back wall that restrains the stack within a back of said chamber; and
   first and second side walls attached to said first and second opposing edges respectively adapted to restrain the stack laterally in said chamber;
   first and second elongated members connected to a portion of said back wall; and
   first and second open regions between said respective elongated members and said respective side walls.

27. The clip of claim 26, wherein said first and second elongated members are attached at proximal ends to the respective first and second side wall and at distal ends to the back wall.

28. The clip of claim 26, wherein a top front portion of the first and second side walls are each resilient and adapted to move outwards to temporarily enlarge a width of the chamber when the stack is being inserted into or removed from said chamber.

29. The clip of claim 26, further comprising first and second tabs attached to a front portion of the first and second sidewalls, respectively, wherein each tab projects into the chamber a predetermined distance and confines the semiconductor stack in the chamber after the semiconductor stack has been inserted into the chamber.

30. The clip of claim 26, further comprising a cut-out region that extends inwardly from the front edge of the base.

31. A method for storing a stack of trays containing a plurality of semiconductor components in a clip comprising:
   providing a clip having a back wall, a front opening, and opposing side walls;
   pushing a stack of semiconductor trays into the front opening of the clip until the trays contact the back wall, and securing the semiconductor stack with resilient members integral with the clip, said resilient members contacting a perimeter area of the stack when a plurality of trays are inserted into the clip.

32. The method of claim 31 wherein a cover is part of the semiconductor stack.

33. The method of claim 31 wherein a portion of said side walls are resilient such that the sidewalls bend outwardly when the stack of trays is inserted into the front opening and collapse back when the stack is pushed against the back wall of the clip.

34. The method of claim 31, wherein said back wall extends orthogonally from the base, and is substantially planar.

35. The method of claim 31, further comprising removing the stack of trays by gripping a cut-out region extending inwardly from the base and pulling the trays out through the front opening.

36. The clip of claim 31, further comprising first and second tabs attached to a front portion of the first and second sidewalls, respectively, wherein each tab projects into the chamber a predetermined distance and confines the semiconductor stack in the chamber after the semiconductor stack has been inserted into the chamber.

* * * * *

UNITED STATES PATENT AND TRADEMARK OFFICE
CERTIFICATE OF CORRECTION

PATENT NO.         : 6,877,194 B2                                              Page 1 of 1
APPLICATION NO.    : 10/619750
DATED              : April 12, 2005
INVENTOR(S)        : Scott C. Bradley et al.

It is certified that error appears in the above-identified patent and that said Letters Patent is hereby corrected as shown below:

Col. 3, line 40, replace the term "wails" with --walls--.

Col. 6, line 2, replace the term "the" with --a--.

Col. 8, line 33, replace the term "clip" with --method--.

Signed and Sealed this

Third Day of July, 2007

JON W. DUDAS
*Director of the United States Patent and Trademark Office*